United States Patent
Tu et al.

(10) Patent No.: US 9,214,955 B2
(45) Date of Patent: Dec. 15, 2015

(54) BOOLEAN ENTROPY DECODER AND BOOLEAN ENTROPY DECODING METHOD FOR VIDEO DISPLAY SYSTEM

(75) Inventors: Ying-Chieh Tu, New Taipei (TW); Jin-Mu Wu, New Taipei (TW)

(73) Assignee: MSTAR SEMICONDUCTOR, INC., Hsinchu County (TW)

( * ) Notice: Subject to any disclaimer, the term of this patent is extended or adjusted under 35 U.S.C. 154(b) by 794 days.

(21) Appl. No.: 13/336,870

(22) Filed: Dec. 23, 2011

(65) Prior Publication Data

US 2013/0083860 A1    Apr. 4, 2013

(30) Foreign Application Priority Data

Sep. 29, 2011 (TW) .............................. 100135360 A

(51) Int. Cl.
    *H04N 19/91* (2014.01)
    *H03M 7/40* (2006.01)
    *H04N 19/44* (2014.01)
    *H04N 19/42* (2014.01)

(52) U.S. Cl.
    CPC ................. *H03M 7/40* (2013.01); *H04N 19/42* (2014.11); *H04N 19/44* (2014.11); *H04N 19/91* (2014.11)

(58) Field of Classification Search
    CPC ........ H04N 19/44; H04N 19/42; H04N 19/91
    USPC .............................. 375/240.25, 241; 712/300
    See application file for complete search history.

(56) References Cited

U.S. PATENT DOCUMENTS

| | | | |
|---|---|---|---|
| 5,963,154 A * | 10/1999 | Wise et al. | 341/67 |
| 7,681,013 B1 * | 3/2010 | Trivedi et al. | 712/7 |
| 8,621,100 B1 * | 12/2013 | Yeluri et al. | 709/234 |
| 8,824,569 B2 * | 9/2014 | Agarwal et al. | 375/241 |
| 2004/0221143 A1 * | 11/2004 | Wise et al. | 712/300 |

* cited by examiner

*Primary Examiner* — Tung Vo
*Assistant Examiner* — Rowina Cattungal
(74) *Attorney, Agent, or Firm* — WPAT, PC; Justin King

(57) ABSTRACT

A Boolean entropy decoder including a decoding module, a buffer and an updating module is provided. The decoder sequentially generates a first boolean value, a second boolean value and a third boolean value. The first and second boolean values are generated during a same cycle. The decoding module requires a first bit amount while generating a first value corresponding to the first boolean value, and requires a second bit amount while generating a second value corresponding to the second boolean value. The buffer temporarily stores a bit segment in the bitstream to be provided to the decoding module. The updating module fetches a new bit segment according to the first bit amount and the second bit amount and updates the buffer. The decoding module selectively updates a value corresponding to the third boolean value after the buffer is updated.

10 Claims, 8 Drawing Sheets

BOOLEAN ENTROPY DECODER AND BOOLEAN ENTROPY DECODING METHOD FOR VIDEO DISPLAY SYSTEM

This application claims the benefit of Taiwan application Serial No. 100135360, filed Sep. 29, 2011, the subject matter of which is incorporated herein by reference.

BACKGROUND OF THE INVENTION

1. Field of the Invention

The invention relates in general to an image processing technique, and more particularly, to a technique for reducing a decoding time and optimizing an image processing efficiency.

2. Description of the Related Art

Persistently expanding sizes of image displays is one of the development trends of a current multimedia display system, and so it is necessary that an operating speed of an image processing apparatus be correspondingly increased. Taking a High-Definition Television (HDTV) monitor as an example, a decoding device in the HDTV monitor needs to process at least 60 1920*1080 frames per second. Therefore, solutions for reducing a cycle and enhancing a decoding efficiency of a decoding device are now much sought for.

A Boolean entropy decoder prevalently implemented as a decoder in an image processing system is for converting a bitstream to a boolean value corresponding to image data. FIG. 1 shows a block diagram of a stereotypic Boolean decoder. In the structure shown, a decoder 100 sequentially generates two boolean values within every cycle T. When generating a boolean value $B_0$, a split $S_0$ corresponding to the boolean value $B_0$ is first calculated according to an equation below:

$$S_0 = 1 + \frac{(R-1) * P_0}{256} \qquad \text{Equation (1)}$$

A range $R_0$ and a value $V_0$ corresponding to the boolean value $B_0$ are associated with a previous boolean value and may be obtained in advance; a probability $P_0$ is obtained from a look-up table. A circuit combination 12A performs operations of Equation (1) to provide the split $S_0$. In practice, the range $R_0$, the split $S_0$ and the value $V_0$ are all integers represented in binary eight bits. The value $V_0$ of an entire frame is usually placed at first eight bits of a bitstream.

A comparator 12B compares the split $S_0$ and the value $V_0$ to determine whether the boolean value $B_0$ is 1 or 0. The boolean value $B_0$ is 1 when the split $S_0$ is smaller than or equals to the value $V_0$, or else is 0 when the split $S_0$ is greater than the value $V_0$.

A range $R_1$ and a value $V_1$ corresponding to the next boolean value $B_1$ are associated with the boolean value $B_0$, and are generated via a renormalization procedure after the boolean value $B_0$ is determined. When the boolean value $B_0$ is 1, an initial value $R_{1(0)}$ of $R_1$ is $R_0$ subtracted by $S_0$ and an initial value $V_{1(0)}$ of $V_1$ is $V_0$ subtracted by $S_0$. When the boolean value $B_0$ is 0, the initial value $R_{1(0)}$ of $R_1$ equals $S_0$ and the initial value $V_{1(0)}$ of $V_1$ equals $V_0$. As shown in FIG. 1, a subtractor 12C is for generating a difference between the range $R_0$ and the split $S_0$. The boolean value $B_0$ is provided to a multiplexer 12D for determining whether the initial value $R_{1(0)}$ provided to a renormalizing unit 12E is the split $S_0$ or the difference between the range $R_0$ and the split $S_0$. Similarly, the boolean value $B_0$ is also provided to a multiplexer 12F for controlling whether the initial value $V_{1(0)}$ provided to a renormalizing unit 12E is the value $V_0$ or the difference between the value $V_0$ and the split $S_0$.

The renormalizing unit 12E then selectively adjusts and confirms the range $R_1$ and the value $V_1$. The approach for the adjustment is represented below as:

$$\text{while } (R_1 < 128)\{R_1 = R_1 * 2; V_1 = [(V_1 * 2) + n\text{bit}(1)]\} \qquad \text{Equation (2)}$$

That is to say, $R_1$ is multiplied by 2 when a current $R_1$ is smaller than 128 until $R_1$ becomes greater than or equal to 128. Each time the range $R_1$ is increased, the value $V_1$ is also correspondingly multiplied by 2 and then added with a first bit of an unused part in the bitstream. Taking $R_1$ becoming greater than 128 after it is multiplied by two for three times as an example, the renormalizing unit 12E fetches first three bits in an unused part in the bitstream to generate the value $V_1$. As shown in FIG. 1, a value $N_1$ represents a number of bits that the renormalizing unit 12E needs to fetch from an unused part of the bitstream to generate the value $V_1$; a value $N_2$ represents a number of bits that a renormalizing unit 14E needs to fetch from an unused part of the bitstream to generate the value $V_2$. A buffer 18 in FIG. 1 temporarily stores an unused segment of the bitstream, which is to be utilized by the renormalizing units 12E and 14E to generate the value $V_1$. That is, when the renormalizing units 12E and 14E respectively generate the values $V_1$ and $V_2$, it is necessary that the buffer 18 be provided with predetermined bits required by operations of the renormalizing units 12E and 14E.

After having confirmed the range $R_1$ and the value $V_1$, a combinational circuit 14A calculates the split $S_1$ according to the range $R_1$, a probability $P_1$ (may be obtained through a look-up table) and Equation (1). By comparing the split $S_1$ and the value $V_1$ generated by the renormalizing unit 12E, a comparator 14B determines whether the boolean value $B_1$ is 1 or 0.

Likewise, a range $R_2$ and a value $V_2$ corresponding to the next boolean value $B_2$ are associated with the boolean value $B_1$, and are generated via a renormalization procedure after the boolean value $B_1$ is determined. As shown FIG. 1, a subtractor 14C is for generating a difference between the range $R_1$ and the split $S_1$. The boolean value $B_1$ is provided to the multiplexer 14D, and is utilized for determining whether an initial value $R_{2(0)}$ of $R_2$ provided to the renormalizing unit 14E is the split $S_1$ or the difference between the range $R_1$ and the split $S_1$. The boolean value $B_1$ is also provided to the multiplexer 14E, and is utilized for determining whether an initial value $V_{2(0)}$ of $V_2$ provided to the renormalizing unit 14E equals to the value $V_1$ or the difference between the value $V_1$ and the split $S_1$. The renormalizing unit 14E then determines the range $R_2$ and the value $V_2$ of the next boolean value $B_2$.

In practice, the circuits 12A to 12E may be utilized to generate the boolean value $B_2$ and the circuits 14A to 14E may be utilized to generate a subsequent boolean value $B_3$—the cycle is repetitively performed to sequentially generate a series of boolean values.

As shown in FIG. 1, an updating unit 16 respectively receives the value $N_1$ from the renormalizing unit 12E and the value $N_2$ from the renormalizing unit 14E. The value $N_1$ represents the number of bits that the renormalizing unit 12E needs to fetch from an unused part of the bitstream to generate the value $V_2$. The value $N_2$ represents the number of bits that a renormalizing unit 14E needs to fetch from an unused part of the bitstream to generate the value $V_2$. According to the values $N_1$ and $N_2$, the updating unit 16 calculates the total number of bits used in the current cycle to update a content of the buffer 18.

FIG. 2 shows an example of a content of the buffer 18. Assume that the buffer 18 has a storage capacity of 16 bits and stores bits [20:35] (i.e. from the 20$^{th}$ bit to the 35$^{th}$ bit) of the bitstream during a first period T1. For example, when a sum of the values $N_1$ and $N_2$ is 8, it means that the first 8 bits [20:27] among the bits [20:35] have been used by the renormalizing units 12E and 14E during the cycle T1. Therefore, the updating unit 16 demands a memory (not shown) of the bitstream and fetches the subsequent 8 bits [36:43] in the bitstream, and updates the content of the buffer 18 to the bits [28:43] before a second cycle T2 starts. That is, the first 8 bits that have already been used are deleted, and the 16 bits that are not yet used are updated into the content of the buffer 18, so as to offer the updated content to the renormalizing units 12E and 14E to generate values $V_3$ and $V_4$ in the second cycle T2. Similarly, the updating unit 16 updates the buffer 18 before a next cycle T3 starts according to the number (the total of the values $N_3$ and $N_4$) of bits that are used in the generation of the values $V_3$ and $V_4$.

Each time in the renormalization procedure, upmost 7 bits are fetched from the bitstream to generate one value V. The capacity of the buffer 18 is generally designed to be sufficient for generating the values V corresponding to two boolean values in a single operating cycle. Referring to FIG. 2, the Boolean entropy decoder 100 generates two boolean values in each cycle, and the content of the buffer 18 varies or remains unchanged along with different numbers of bits consumed in the cycles.

With respect to the structure in FIG. 1, the value $N_1$ must be generated before the value $N_2$, and the updating unit 18 can only determine the number of bits to be fetched to update the content of the buffer 18 after the renormalizing unit 14E generates the value $N_2$. Taking FIG. 2 as an example, the renormalizing unit 14E generates the value $N_2$ at a time point $t_{A1}$, and the updating unit 16 fetches needed bits from the bitstream for updating the buffer 18 during the remaining time period from the time point $t_{A1}$ to the end of the cycle T1. That is to say, only after the content of the buffer 18 is completely updated, does the next cycle T2 begin. Therefore, it is observed that the time spent for fetching data and updating the buffer prolongs the cycles of the Boolean entropy decoder 100, such that a corresponding operating frequency is lowered to even lead to a failure of the Boolean entropy decoder 100 in meeting requirements of certain high definition video systems.

SUMMARY OF THE INVENTION

In the view of the above issues, the invention is directed to a novel Boolean entropy decoder that shortens cycles by changing a time point of data fetching. In addition, by simultaneously calculating various possible results with several circuits, time needed for decoding may be further reduced.

According to an embodiment of the present invention, a Boolean entropy decoder for converting a bitstream to a plurality of boolean values is provided. The decoder comprises a decoding module, a buffer and an updating module. The decoder sequentially generates a first boolean value, a second boolean value and a third boolean value according to the bitstream. The first boolean value and the second boolean value are generated during a same cycle. The decoding module requires a first bit amount while generating a first value corresponding to the first boolean value, and requires a second bit amount while generating a second value corresponding to the second boolean value. The buffer temporarily stores a bit segment of the bitstream to be provided to the decoding module. The bit segment covers at least the first bit amount and the second bit amount. The updating module fetches a new bit segment according the first bit amount and the second bit amount to update the buffer. The decoding module selectively adjusts a value corresponding to the third boolean value after the buffer is updated.

According to another embodiment of the present invention, a Boolean entropy decoding method applied to a video display system is provided. The Boolean entropy decoding method converts a bitstream to a plurality of boolean values corresponding to image data. The video display system comprises a buffer for temporarily storing a bit segment of the bitstream. The method comprises: generating a value corresponding to a first boolean value by utilizing a first segment having a first bit amount in the bit segment; generating the first boolean value during a first cycle; generating a value corresponding to a second boolean value by utilizing a second segment having a second bit amount in the bit segment; fetching the new bit segment from the bitstream according the first bit amount and the second bit amount, and updating the buffer according to the new bit segment; generating the second boolean value and a value corresponding to a third boolean value also during the first cycle; selectively adjusting the value corresponding to the third boolean value after the buffer is updated; and generating the third boolean value during a second cycle.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3:
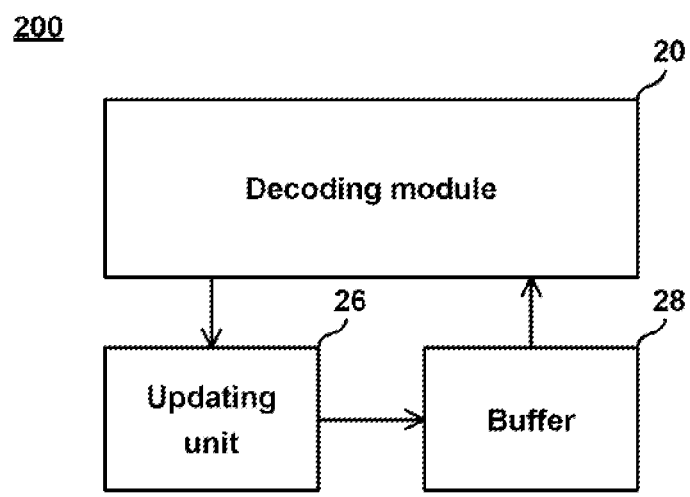
FIG. 3 is a circuit block diagram of a Boolean entropy decoder for converting a bitstream to a plurality of boolean values according to an embodiment of the present invention.

FIG. 3 shows a block diagram of a Boolean entropy decoder for converting a bitstream to a plurality of boolean values according to an embodiment of the present invention. A Boolean entropy decoder 200 comprises a decoding module 20, an updating module 26 and a buffer 28. In practice, the Boolean entropy decoder 200 may be integrated in various multimedia systems adopting Boolean encoding, e.g., a VP8-compliant video processing system.

For example, the decoding module 20 may be designed to comprise the circuits 12A to 12E and the circuits 14A to 14E. According to a bitstream input to the Boolean entropy decoder 200, the decoding module 20 sequentially generates a first boolean value $B_1$, a second boolean value $B_2$ and a third boolean value $B_3$. It should be noted that, in this embodiment, the first boolean value $B_1$ and the second boolean value $B_2$ are generated during a same cycle, whereas the third boolean value $B_3$ is generated during a next cycle. Taking the boolean values $B_1$ to $B_3$ shown in FIG. 4 as an example, the first boolean value $B_1$ may be generated by the circuits 12A to 12E during the first half of a first period T1, the second boolean value $B_2$ may be generated by the circuits 14A to 14E during the second half of the first period T1, the third boolean value $B_3$ may be generated by the circuits 12A to 12E during the first half of a second period T2, and so forth.

The decoding module 20 requires a first bit amount $N_1$ while generating a value $V_1$ corresponding to the first boolean value $B_1$, and requires a second bit amount $N_2$ while generating a value $V_2$ corresponding to the second boolean value $B_2$. The first bit amount $N_1$ represents the number of bits in the buffer required when the bitstream is fetched for generating the value $V_1$ in a renormalization procedure; the second bit amount $N_2$ represents the number of bits in the buffer required when the bitstream is fetched for generating the value $V_2$ in the renormalization procedure. The buffer 28 temporarily stores a bit segment of the bitstream to be used by the decoding module 20 for generating the values V. Taking the boolean values $B_1$, $B_2$ and $B_3$ in FIG. 4 as an example, the first bit amount $N_1$ is determined in the renormalization procedure after a boolean value $B_0$ is generated during a cycle T0; that is, the decoding module 20 fetches the specific $N_1$ number of bits from the buffer 28 at a time point t1 The second bit amount $N_2$ is determined in the renormalization procedure after the boolean value $B_1$ is generated during the cycle T1; that is, the decoding module 20 fetches the specific $N_2$ number of bits from the buffer 28 at a time point t2.

Figure 4:
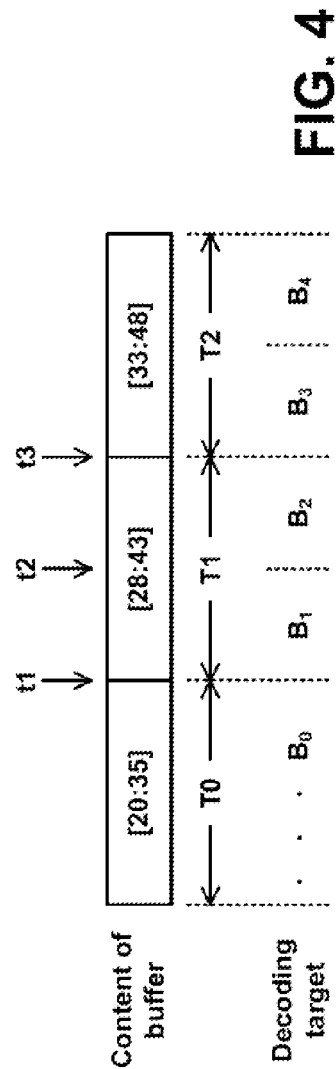
FIGS. 4 and 5 are examples of a content of a buffer according to an embodiment of the present invention.

After the second bit amount $N_2$ is determined by the decoding module 20 during the cycle T1, the updating module 26 according to this embodiment fetches a new bit segment from the bitstream according to the second bit amount $N_2$ as well as the first bit amount $N_1$ generated during the previous cycle T0. Being distinct from the prior art, while in the prior art, the number of bits to be fetched from the bitstream is calculated according to two bit amounts determined in the same cycle (e.g., the bit amounts $N_2$ and $N_3$ in the same cycle T1), the updating module 26 in the present embodiment calculates the number of bits to be fetched from the bitstream according to the bit amounts obtained from two different cycles, i.e., the bit amount determined during the second half of the previous cycle and the bit amount determined during the first half of the next cycle. An example is depicted in FIG. 4, the first bit amount $N_1$ is generated at the time point t1, and the second bit amount $N_2$ is generated at the time point t2. After determining the second bit amount $N_2$ at the time point t2, the updating module 26 in this embodiment determines how a content of the buffer 28 is to be updated according to a sum of $N_1$ and $N_2$.

On the other hand, as shown in FIG. 4, the time point at which the buffer 28 is updated in this embodiment is still before each cycle ends (e.g., a time point t3 at which the third bit amount $N_3$ is generated). By separately performing fetching the required bits and updating the buffer at different time periods to fetch the required bits for subsequently updating the buffer between the time points t2 and t3 in advance, after the time point t3, the updating module 26 only needs to update the content of the buffer 28, and thus saves the time for fetching the required bits. Therefore, cycles of the Boolean entropy decoder 200 may be shortened to equivalently increase an operating frequency of the Boolean entropy decoder 200.

Referring to FIG. 4, assume the decoding module 20 determines that the first bit amount $N_1$ equals 5 at the time point t1, and determines that the second bit amount $N_2$ equals 0 at the time point t2. According to the sum of $N_1$ and $N_2$, the updating module 26 learns that the first 5 bits out of the bits [28:43] stored in the buffer 28 (i.e., bits segment [28:32] out of [28:43]) have been used by the decoding module 20. Hence, at the time point t2 the updating module 26 requests the memory (not shown) storing the bitstream to fetch the 5 subsequent unused bits started from the end of the bit segment [28:43] (i.e., the bits [44:48]). In practice, the time spent on data fetching is shorter than an interval between the time points t2 and t3, and so the updating module 26 is able to complete the data fetching before the time point t3. At the time point t3, the updating module 26 loads the new bit segment into the buffer 28 to update the content of the buffer 28 to [33:48]. In another embodiment, the updating module 26 may update the content of the buffer 28 immediately after completing the data fetching rather than updating the buffer 28 at the time point t3.

Figure 5:
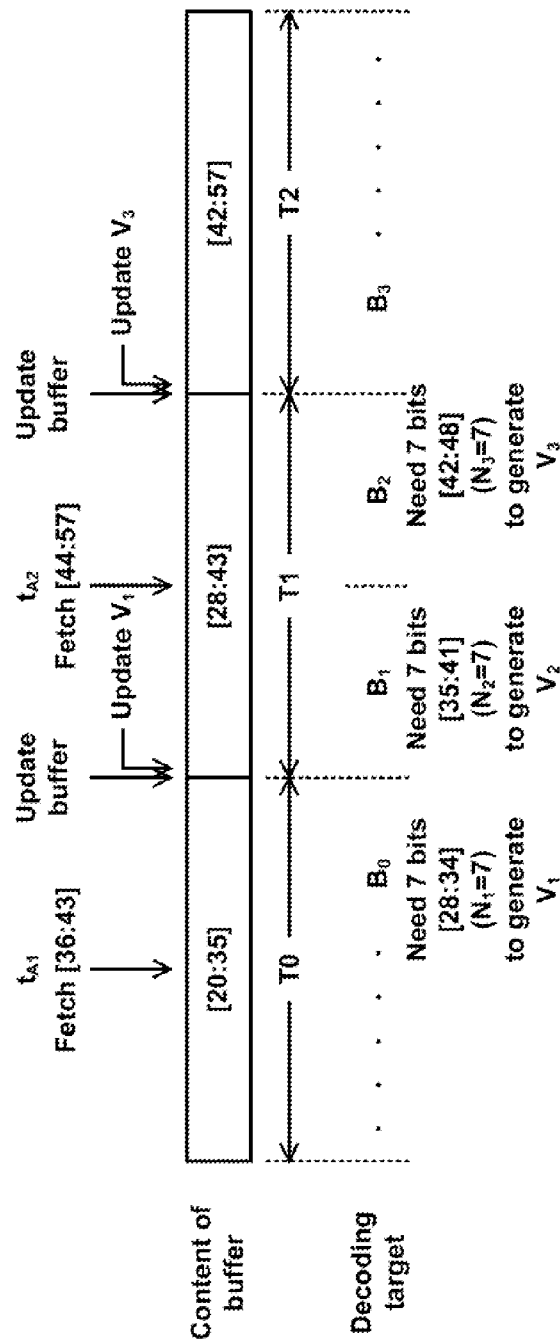

Another example of a content of the buffer 28 is depicted in FIG. 5 according to an embodiment of the present invention. During the cycle T0, suppose that two previous renormalization procedures have used 8 bits [20:27] in the bit segment [20:35] in the buffer 28, the updating module fetches subsequent 8 bits [36:43] started from the end of bit segment [20:35] at a time point $t_{A1}$ in preparation so that the updating module 26 can update the content of the buffer 28 to [28:43] for the next time. As shown in FIG. 5, the updating module 26 updates the content of the buffer 28 at the end of the renormalization procedure after the boolean value $B_0$ is generated, i.e. the end of the cycle T0. As stated above, the renormalization procedure at the second half of the cycle T0 determines the value $V_1$ corresponding to the first boolean value $B_1$. In this example, 7 bits [28:34] in the bit stream are required to generate the value $V_1$, and therefore the bit amount $N_1$ equals 7.

At the time point $t_{A2}$, the decoding module 20 finishes the renormalization procedure after the boolean value $B_1$ is generated. In this example, 7 bits [35:41] in the bit stream are required to generate the value $V_2$, and therefore the bit amount $N_2$ equals 7. The updating module 26 instantaneously acquires that a total of 14 bits [28:41] are required to generate the value $V_1$ and the value $V_2$, thereby fetches the subsequent 14 bits [44:57], which are not yet loaded to the buffer 28, immediately after a time point $t_{A2}$, and updates the content of the buffer 28 at the end of the cycle T1 to bits [42:57].

Referring to FIG. 5, 7 bits [42:48] of the bitstream are required for generating the value $V_3$. It should be noted that, although the content of the buffer 28 during the cycle T1 is insufficient for the renormalization procedure for generating the value $V_3$, the decoding module 20 may not start to update the value $V_3$ until the content of the buffer 28 is updated to the bits [42:57] (or even after the cycle V2) according to the content (i.e., bits [42:57]) of the buffer 28. More specifically, the decoding module 20 first calculates that $R_{3(O)}$ only becomes larger than 128 after multiplying by 2 for seven times in the renormalization procedure during the second half of the cycle T1, and thus obtains that the third bit amount $N_3$ equals 7. Correspondingly, in the above renormalization procedure, $V_{3(O)}$ is also multiplied by 2 for seven times to obtain $V_3$ to be updated. When the content of the buffer 28 is updated to the bits [42:57], the decoding module 20 fetches the bits [42:48] from the buffer 20 and adds the bits [42:48] to the $V_3$ to be updated, so as to update the value $V_3$ to a correct result for generating the boolean value $B_3$.

It should be noted that, in the event that the content stored in the buffer 28 during the cycle T1 is sufficient for generating the value $V_3$, the decoding module 20 does not need to adjust the value $V_3$ after updating the buffer 28. In conclusion, the decoding module 20 selectively adjusts the value $V_3$ corresponding to the third boolean value $B_3$ after the buffer 28 is updated. It can be seen from the above examples that the content stored in the buffer 28 during the time period T1 is for the use of the renormalization procedure after the boolean values $B_0$ and $B_1$ are generated. Similarly, the content stored in the buffer 28 during the time period T2 is for the use of the renormalization procedure after the boolean values $B_2$ and $B_3$ are generated. Therefore, the bit segment stored in the buffer 28 during the cycle T1 needs only to cover the first bit amount $N_1$ and the second bit amount $N_2$. For example, when the first bit amount $N_1$ and the second bit amount $N_2$ are respectively upmost 7 bits, a sum of the first bit amount $N_1$ and the second bit amount $N_2$ is upmost 14, which is sufficiently covered by a buffer 28 with a capacity of 16 bits.

An example of generating the boolean values $B_0$ and $B_1$ during a same cycle T is given to illustrate another embodiment of the decoding module 20. As previously described, the boolean value $B_0$ may be 1 or 0, and the renormalization procedure after the boolean value $B_0$ is generated may generate upmost eight results (respectively corresponding to $N_1=0\sim7$). Consequently, there are 16 possibilities as a result of the renormalization procedure after the boolean value $B_0$ is generated. In the descriptions below, a probability $P_1$ equals $P_L$ when the boolean value $B_0$ is 0, and $P_1$ equals $P_M$ when the boolean value $B_0$ is 1.

A situation of the boolean value $B_0$ being equal to 0 and $N_1$ being equal to 0 shall be discussed. Under the above conditions, $R_1$ has the initial value $R_{1(0)}$ equal to split $S_0$ and is greater than or equal to 128. Thus, $$S_0 = 1 + \frac{(R_0 - 1)*P_0}{256} \geq 128 \qquad \text{Equation (1A)}$$

From Equation (1A):

$$\frac{(R_0 - 1)*P_0}{256} > 126 \qquad \text{Equation (1B)}$$

By representing an adjusted split $$\frac{(R_0 - 1)*P_0}{256}$$

with a value $S_0\_m1$, Equation (1B) becomes:

$$S_0\_m1 > 126 \qquad \text{Equation (1C)}$$

That is, Equation (1C) is established when the boolean value $B_0$ equals 0 and $N_1$ equals 0. In other words, when the boolean value $B_0$ equals 0, Equation (1C) determines the value $N_1$ according to a value of $S_0\_m1$.

Furthermore, the initial value $V_{1(0)}$ equals $V_0$, and the renormalization procedure does not need to adjust $R_{1(0)}$ and $V_{1(0)}$. In other words, $R_1$ equals $R_{1(0)}$ which also equals $S_0$. Therefore, in the next step of comparing $V_1$ and $S_1$ to determine whether the boolean value $B_1$ is 1 or 0, it is comparing whether $V_0$ is larger than or equal to $$1 + \frac{(S_0 - 1)*P_L}{256},$$

which is in equivalence comparing whether $V_0$ is larger than $$\frac{(S_0 - 1)*P_L}{256}.$$

Accordingly, an equation for determining whether the boolean value $B_1$ is 1 or 0 is represented as:

$$V_0 > ? \frac{(S_0 - 1)*P_1}{256} = \frac{\frac{(R_0 - 1)*P_0}{256}*P_L}{256} \qquad \text{Equation (1D)}$$

By representing $$\frac{(R_0 - 1)*P_0}{256}$$

by the value $S_0\_m1$, Equation (1D) is rewritten as:

$$V_0 > ? \frac{S_0\_m1 * P_L}{256} \qquad \text{Equation (1E)}$$

It is concluded from Equations (1C) and (1E), by defining the value $S_0\_m1$, this embodiment is capable of simultaneously simplifying the equations for determining $N_1$ and the boolean value $B_1$, so that the boolean value $B_1$ is generated and the associated parameters are determined by implementing less hardware according to this embodiment. The descriptions below are also given in compliance to the principle of simplifying the equations for determining $N_1$ and the boolean value $B_1$. A situation where the boolean value $B_0$ equals 0 and $N_1$ equals 1 shall be discussed. Under the above conditions, the initial value $R_{1(0)}$ of $R_1$ equals $S_0$ and is smaller than or equal to 64. Thus, $$128 > S_0 = 1 + \frac{(R_0 - 1)*P_0}{256} \geq 64 \qquad \text{Equation (2A)}$$

From Equation (2A):

$$126 \geq S_0\_m1 > 62 \qquad \text{Equation (2B)}$$

That is, Equation (2B) is established when the boolean value $B_0$ equals 0 and $N_1$ equals 1.

Furthermore, the initial value $V_{1(0)}$ of $V_1$ equals $V_0$, and $R_{1(0)}$ and $V_{1(0)}$ need to be adjusted in the renormalization procedures. In other words, $R_1$ equals $R_{1(0)}$ multiplied by 2 and also equals $S_0$ multiplied by 2; $V_1$ equals $V_{1(0)}$ multiplied by 2 plus one unused bit in the bitstream and also equals $V_1$ multiplied by 2 plus one unused bit in the bitstream. Therefore, in the next step of comparing $V_1$ and $S_1$ to determine whether the boolean value $B_1$ is 1 or 0, it is determining whether the equation below is established:

$$\{V_0, nbit(1)\} \geq 1 + \frac{(R_1 - 1)*P_L}{256} \qquad \text{Equation (2C)}$$

$\{V_0, nbit(1)\}$ represents the adjustment described in Equation (2) (multiplied by 2 plus one unused bit in the bitstream) is performed once on $V_0$.

Equation (2C) can be rewritten as:

$$\{V_0, nbit(1)\} > \frac{(2S_0 - 1) * P_L}{256} \qquad \text{Equation (2D)}$$

Therefore, the equation for determining whether the boolean value $B_1$ is 1 or 0 is represented as:

$$\{V_0, nbit(1)\} > ? \frac{\left[\frac{(R_0 - 1) * P_0}{256} * 2 + 1\right] * P_L}{256} \qquad \text{Equation (2E)}$$

Equation (2E) may be rewritten as:

$$\{V_0, nbit(1)\} > ? \frac{[S_0\_m1 * 2 + 1] * P_L}{256} \qquad \text{Equation (2F)}$$

Accordingly, it is deduced that when the boolean value $B_0$ equals 0 and $N_1$ equals 2, the equation below is established:

$$62 \geq S_0\_m1 > 30 \qquad \text{Equation (3A)}$$

The equation for determining whether the boolean value $B_1$ is 0 or 1 is represented as:

$$\{V_0, nbit(2)\} > ? \frac{[S_0\_m1 * 4 + 3] * P_L}{256} \qquad \text{Equation (3B)}$$

$\{V_0, nbit(2)\}$ represents the adjustment described in Equation (2) is performed twice on $V_0$.

When the boolean value $B_0$ equals 0 and $N_1$ equals 3, the equation below is established:

$$30 \geq S_0\_m1 > 14 \qquad \text{Equation (4A)}$$

The equation for determining whether the boolean value $B_1$ is 0 or 1 is represented as:

$$\{V_0, nbit(3)\} > ? \frac{[S_0\_m1 * 8 + 7] * P_L}{256} \qquad \text{Equation (4B)}$$

When the boolean value $B_0$ equals 0 and $N_1$ equals 4, the equation below is established:

$$14 \geq S_0\_m1 > 6 \qquad \text{Equation (5A)}$$

The equation for determining whether the boolean value $B_1$ is 0 or 1 is represented as:

$$\{V_0, nbit(4)\} > ? \frac{[S_0\_m1 * 16 + 15] * P_L}{256} \qquad \text{Equation (5B)}$$

When the boolean value $B_0$ equals 0 and $N_1$ equals 5, the equation below is established:

$$6 \geq S_0\_m1 > 2 \qquad \text{Equation (6A)}$$

The equation for determining whether the boolean value $B_1$ is 0 or 1 is represented as:

$$\{V_0, nbit(5)\} > ? \frac{[S_0\_m1 * 32 + 31] * P_L}{256} \qquad \text{Equation (6B)}$$

When the boolean value $B_0$ equals 0 and $N_1$ equals 6, the equation below is established:

$$2 \geq S_0\_m1 > 0 \qquad \text{Equation (7A)}$$

The equation for determining whether the boolean value $B_1$ is 0 or 1 is represented as:

$$\{V_0, nbit(6)\} > ? \frac{[S_0\_m1 * 64 + 63] * P_L}{256} \qquad \text{Equation (7B)}$$

When the boolean value $B_0$ equals 0 and $N_1$ equals 7, the equation below is established:

$$S_0\_m1 = 0 \qquad \text{Equation (8A)}$$

The equation for determining whether the boolean value $B_1$ is 0 or 1 is represented as:

$$\{V_0, nbit(7)\} > ? \frac{[S_0\_m1 * 128 + 127] * P_L}{256} \qquad \text{Equation (8B)}$$

Figure 6:
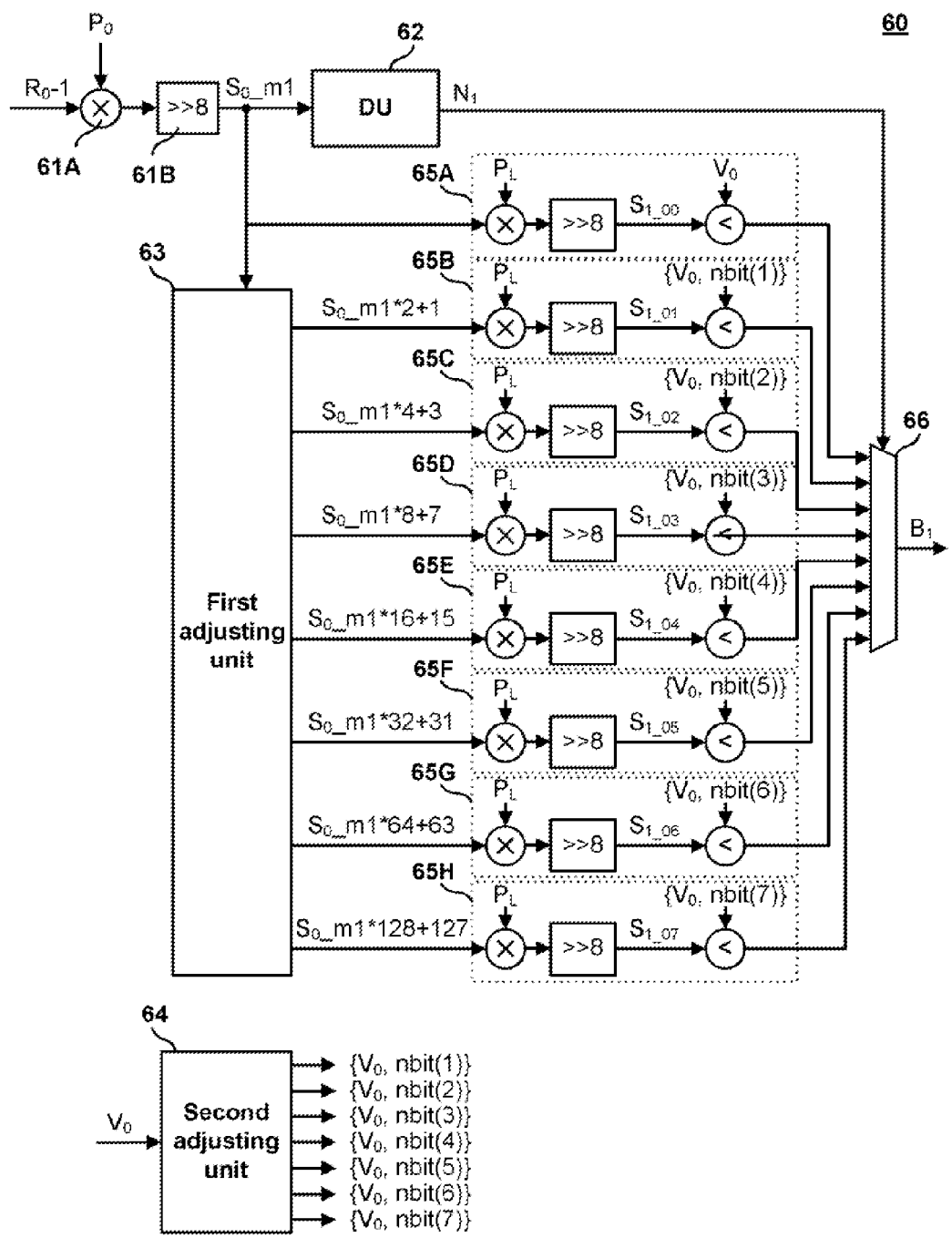
FIGS. 6, 7, 8 and 9 are respectively a partial circuit block diagram of a decoding module according to an embodiment of the present invention.

In conclusion, depending on which of the ranges divided by the 7 numbers of 0, 2, 6, 14, 30, 62 and 126 the value $S_0\_m1$ falls in, it may be determined $N_1$ is which of the value between 0 to 7. FIG. 6 shows an example of a circuit for realizing the abovementioned equations. A multiplier 61A and a divider 61B perform preliminary operations to generate $S_0\_m1$. A determining unit 62 determines $N_1$ is which of the value from 0 to 7.

A first adjusting unit 63, a second adjusting unit 64 and circuit combinations 65A to 65H respectively generates eight boolean values $B_1$ corresponding to different values of $N_1$ according to the above equations for determining the boolean value $B_1$, and a multiplexer 66 selects a correct boolean value $B_1$ from the outputs of the circuit combinations 65A to 65H according to $N_1$ outputted by the determining unit 62. The first adjusting unit 63 respectively calculates seven reference ranges of $S_0\_m1*2+1$, $S_0\_m1*4+3$, $S_0\_m1*8+7$, $S_0\_m1*16+15$, $S_0\_m1*32+31$, $S_0\_m1*64+63$ and $S_0\_m1*128+127$ according to $S_0\_m1$ outputted by the divider 61B. The second adjusting unit 64 calculates seven reference values of $\{V_0, nbit(1)\}$, $\{V_0, nbit(2)\}$, $\{V_0, nbit(3)\}$, $\{V_0, nbit(4)\}$, $\{V_0, nbit(5)\}$, $\{V_0, nbit(6)\}$ and $\{V_0, nbit(7)\}$ according to $V_0$. In practice, instead of requiring the additional hardware of the adder and the multiplier, the first adjusting unit 63 can generate the above seven reference ranges by shifting $S_0\_m1$ to the left and adding 1 to the least significant bit.

The circuit combination 65A receives $V_0$ and $S_0\_m1$ outputted by the divider 61B, and performs the operations of Equation (1E) to generate the corresponding boolean value $B_1$ when the boolean value $B_0$ equals 0 and $N_1$ equals 0. The circuit combination 65B receives $S_0\_m1*2+1$ outputted by the first adjustment unit 63 and $\{V_0, nbit(1)\}$ outputted by the second adjustment unit 64, and performs the operations of Equation (2F) to generate the corresponding boolean value $B_1$ when the boolean value $B_0$ equals 0 and $N_1$ equals 1. As shown in FIG. 6, the circuit combinations 65C to 65H respectively generate the boolean value $B_1$ corresponding to the other six conditions. The multiplexer 66 then selects the correct $B_1$ from the outputs of the 65A to 65H according to $N_1$ outputted by the determining unit 62.

Referring to FIG. 6, an input signal received by the multiplier 61a is ($R_0$-1) rather than $R_0$. In practice, operations for ($R_0$-1) may be combined into the prior renormalization procedure for generating $R_0$ to eliminate one subtractor.

Figure 7:
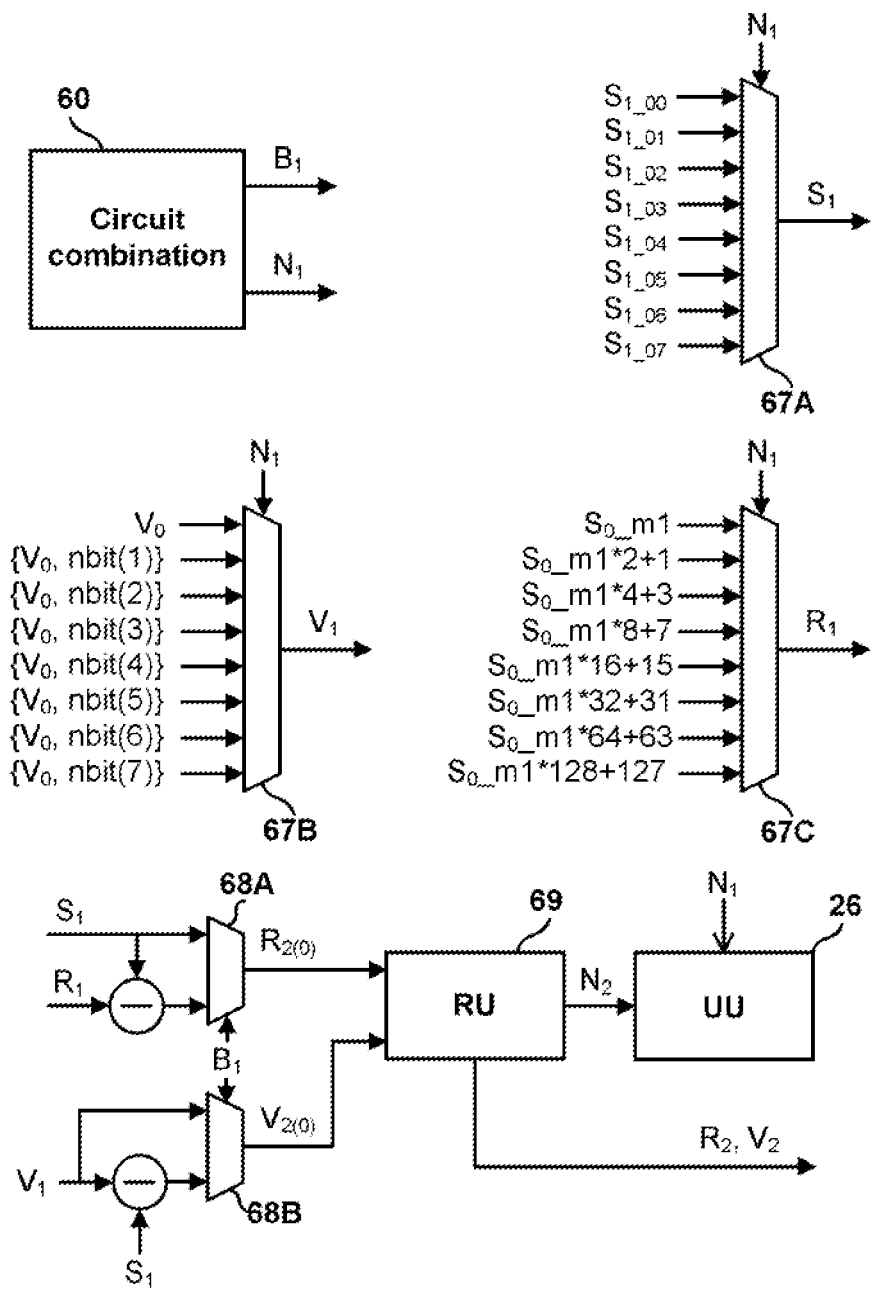

Referring to FIG. 7, apart from the circuit combination 60 shown in FIG. 6, the decoding module 20 according to an embodiment of the present invention may further comprise multiplexers 67A to 67C, 68A and 68B, and a renormalizing unit 69. According to $N_1$ generated by the circuit combination 60, the multiplexer 67A selects $S_1$ corresponding to $N_1$ from $S_{1\_00}$ to $S_{1\_07}$ shown in FIG. 6. The multiplexer 67B selects $V_1$ corresponding to $N_1$ from eight values of $V_0$, $\{V_0, \text{nbit}(1)\}$ to $\{V_0, \text{nbit}(7)\}$ according to $N_1$. The multiplexer 67C selects $R_1$ corresponding to $N_1$ from eight values of $S_0\_m1*2+1$ to $S_0\_m1*128+127$ according to $N_1$.

According to $N_1$ generated by the circuit combination 60, the multiplexer 68A selects either $S_1$ or the difference between $S_1$ and $R_1$ as the initial value $R_{2(0)}$ of $R_2$ corresponding to the boolean value $B_2$. The multiplexer 68B selects either $V_1$ or the difference between $V_1$ and $S_1$ as the initial value $V_{2(0)}$ of $V_2$ corresponding to the boolean value $B_2$ according to the boolean value $B_1$. The initial values $R_{2(0)}$ and $V_{2(0)}$ are provided to the renormalizing unit 69, which next determines $R_2$, $V_2$ and $N_2$ corresponding to the boolean value $B_2$. According to $N_2$ outputted by the renormalizing unit 69 and $N_1$ previously generated by circuit combination 60, the updating module 26 determines how the content of the buffer 28 is to be updated. Details of updating the buffer 28 are described above and omitted herein.

Figure 8:
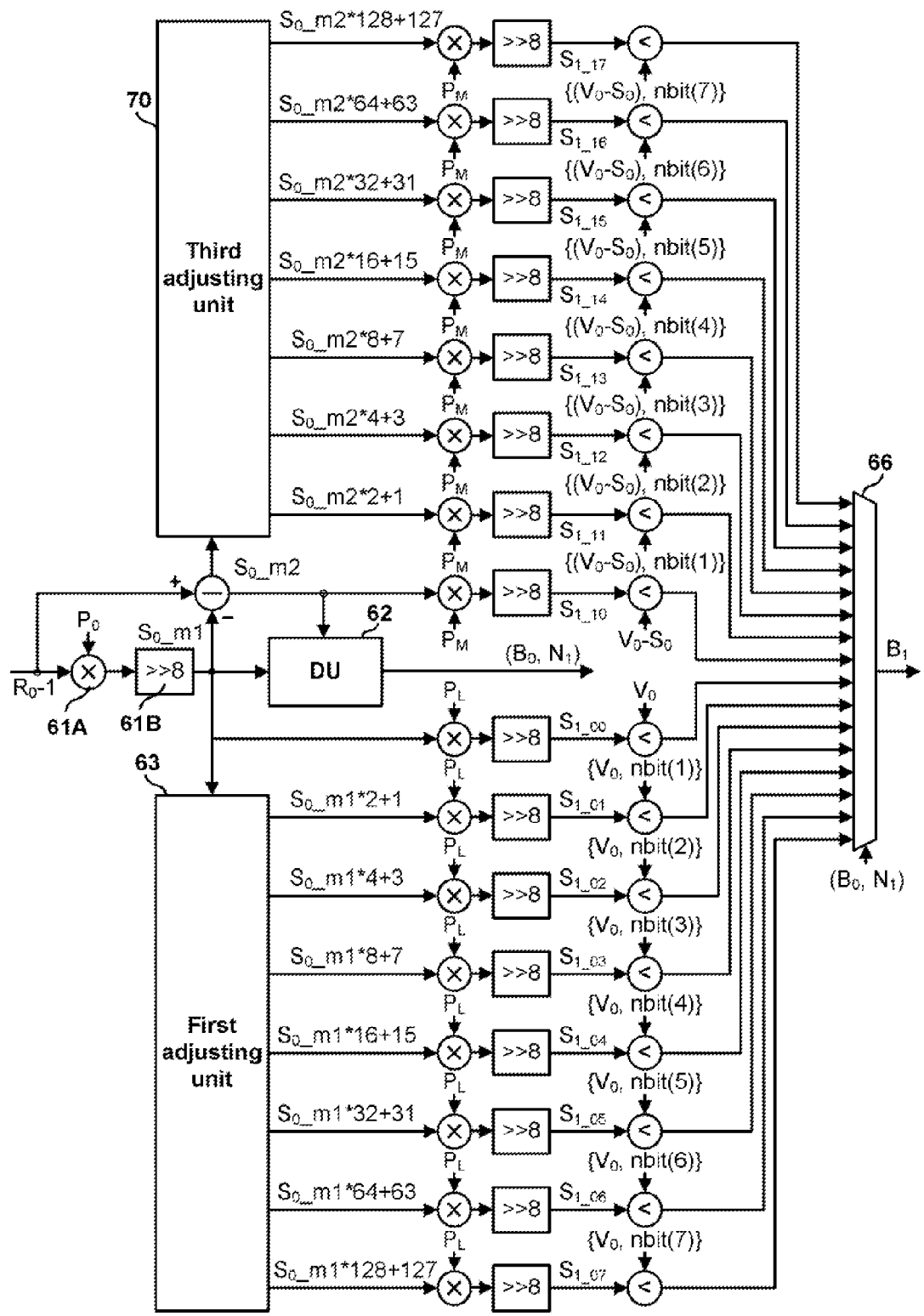

Likewise, the eight situations when the boolean value $B_0$ equals 1 may also be deduced to another eight sets of equations, and may be realized by the circuit combinations similar to those shown in FIG. 6 and integrated with the circuit in FIG. 7. That is, similarly via the defined value of $S_0\_m1$, equations for determining $N_1$ when the boolean value $B_0$ equals 1 and for determining the boolean value $B_1$ can be simplified; in this way, the boolean value $B_1$ can be generated and the associated parameters can be determined with less hardware according to this embodiment. FIG. 8 shows an example of a circuit integrating that covering 16 possibilities. As shown in FIG. 8, a difference between the value ($R_0$-1) and $S_0\_m1$ is further defined as $S_0\_m2$ for simplifying equations for determining $N_1$ and the boolean value $B_1$. In this example, according to the values $S_0\_m1$ and $S_0\_m2$, the determining unit 62 may determine whether the boolean value 0 is 0 or 1 and $N_1$ is which of the values from 0 to 7. For example, when the boolean value $B_0$ equals 1 and $N_1$ equals 0, it means the initial value $R_{1(0)}$ of $R_1$ equals ($R_0$-$S_0$) is greater than or equals to 128. Hence:

$$R_0-S_0=R_0-(1+S_0\_m1)=(R_0-1)-S_0\_m1 \geq 128 \quad \text{Equation (9A)}$$

Equation (9A) may be rewritten as:

$$S_0\_m2 > 127 \quad \text{Equation (9B)}$$

When a relationship between the value $S_0\_m1$ and $R_0$ matches Equation (9B), the determining unit 62 then determines that the boolean value $B_0$ equals 1 and $N_1$ equals 0.

Furthermore, the initial value $V_{1(0)}$ of $V_1$ equals ($V_0$-$S_0$), and the renormalization procedure does not need to adjust $R_{1(0)}$ and $V_{1(0)}$. In the next step of comparing $V_1$ and $S_1$ to determine whether the boolean value $B_1$ is 1 or 0, it is in equivalence determining whether the equation below is established:

$$V_0 - S_0 \geq ? 1 + \frac{(R_1-1)*P_M}{256} = 1 + \frac{(R_0-S_0-1)*P_M}{256} \quad \text{Equation (9C)}$$

Equation (9C) may be rewritten as:

$$V_0 - S_0 > ? \frac{S_0\_m2 * P_M}{256} \quad \text{Equation (9D)}$$

Other seven sets of equations for describing correlations when the boolean value $B_0$ equals 1 and $N_1$ equals 1 to 7 may be similarly deduced.

Referring to FIG. 8, a third adjusting unit 70 respectively calculates seven values of $S_0\_m1*2+1$, $S_0\_m1*4+3$, $S_0\_m1*8+7$, $S_0\_m1*16+15$, $S_0\_m1*32+31$, $S_0\_m1*64+63$ and $S_0\_m1*128+127$ according to $S_0\_m2$. In this example, the multiplexer 66 selects the corresponding boolean value $B_1$ according to the boolean value $B_0$ and the value $N_1$ provided by the determining unit 62. Similarly, $S_1$, $V_1$ and $R_1$ corresponding to the boolean value $B_0$ and the value $N_1$ are also selected according to the boolean value $B_0$ and the value $N_1$ provided by the determining unit 62, and are provided to a subsequent circuit for generating the boolean value $B_2$.

Figure 9:
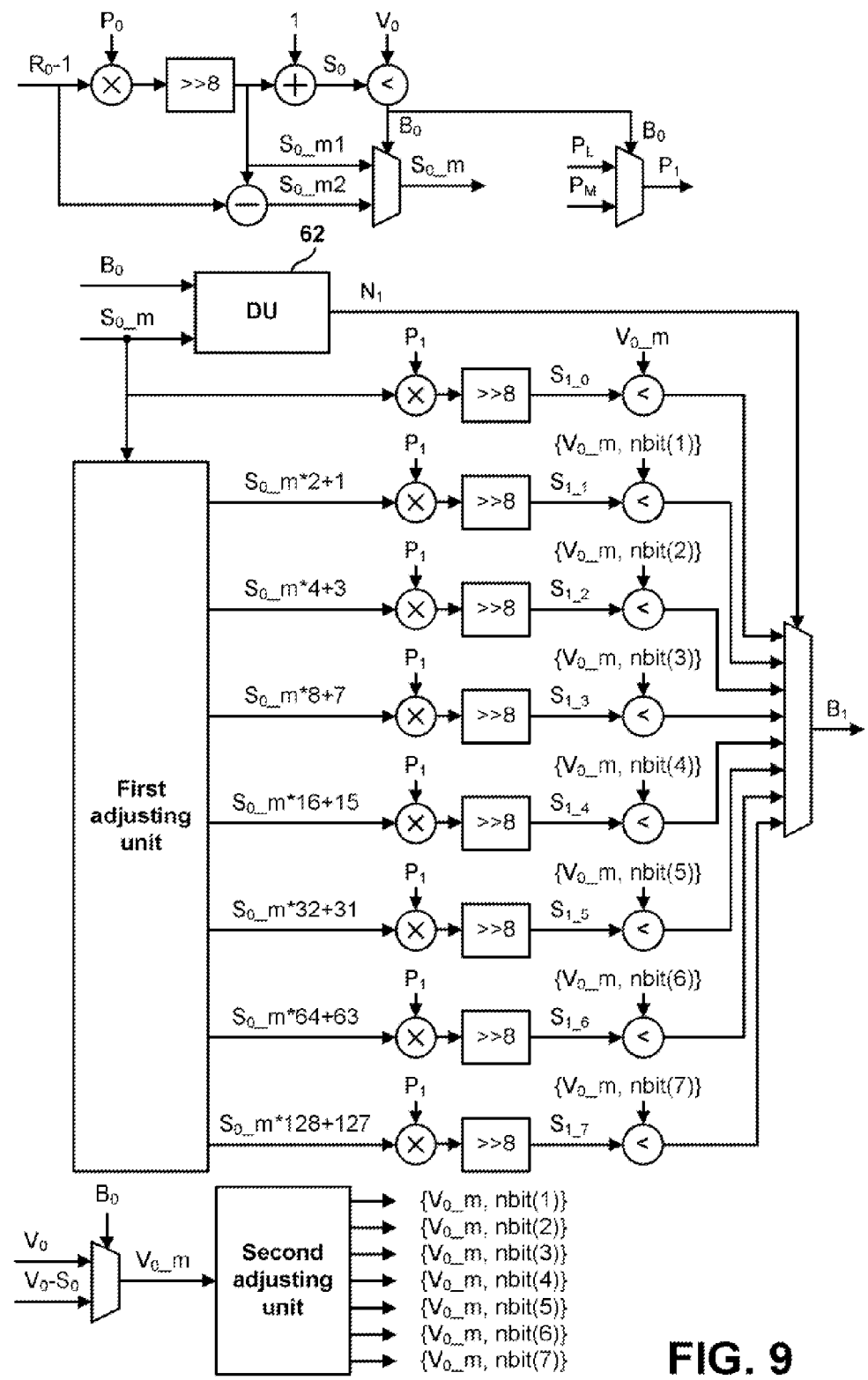

FIG. 9 shows an example of a simplified circuit of the circuit in FIG. 8. In this example, it is first determined whether the $B_0$ is 1 or 0, and the value $N_1$ is then determined by the determining unit 62. Subsequent adjusting units, multipliers, adders and comparators are shared by two situations when the boolean value $B_0$ equals 1 or 0. Therefore, the boolean value $B_0$ is utilized for controlling a plurality of multiplexers for selecting the values inputted to the determining unit 62, the multipliers and the comparators. Operation details of the circuit in FIG. 9 may be appreciated with reference to the descriptions of foregoing examples and are therefore omitted herein.

It is seen from the above example that, according to possible results generated by a decoding process, the decoding module 20 may be decomposed into a plurality of sets of circuits, which simultaneously calculate output results corresponding to various possibilities. Taking the circuit in FIG. 8 as an example, the boolean value $B_1$ may be generated before $V_1$ and R1 being determined, such as being determined by the renormalizing unit 12E in FIG. 1. Therefore, the cycle T of the Boolean entropy decoder 200 may be further shortened to increase the operating frequency of the Boolean entropy decoder 200. It should be noted that, as shown in FIG. 8, since components for performing the operations of the decomposed circuit are generally multipliers, dividers and comparators, a corresponding circuit structure is simpler than circuits having additional adders and subtractors, so as to reduce a chip area.

Figure 10:
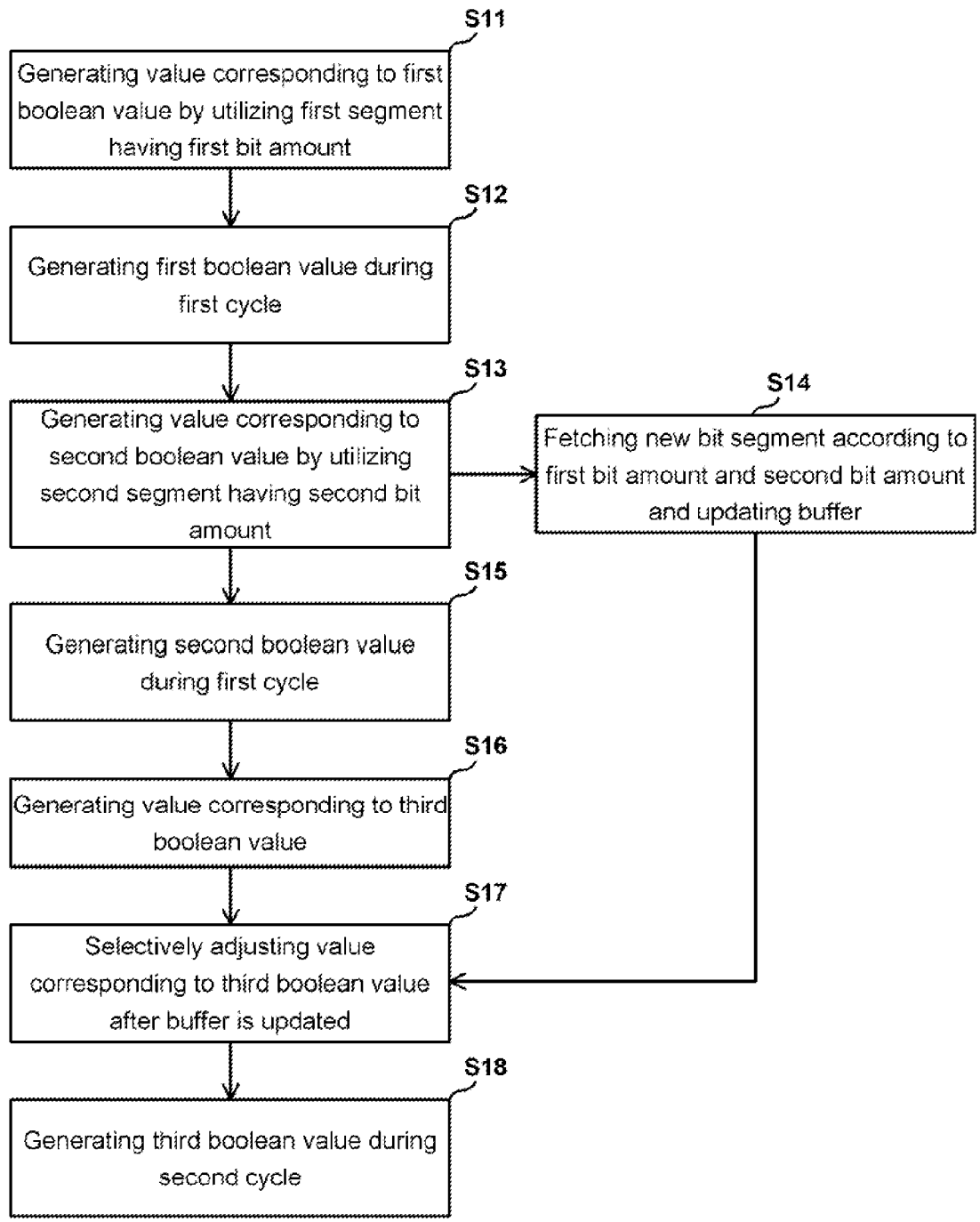
FIG. 10 is a flowchart of a Boolean entropy decoding method according to an embodiment of the present invention.

FIG. 10 shows a flowchart of a Boolean entropy decoding method applied to a video display system provided according to another embodiment of the present invention. The video display system comprises a buffer for temporarily storing a bit segment of a bitstream. Step S11 comprises generating a value $V_1$ corresponding to a first boolean value $B_1$ by utilizing a first segment having a first bit amount $N_1$ in the bit segment. Taking the situation in FIG. 4 as an example, the first bit amount $N_1$ is generated in the second half of the renormalization procedure during the cycle T0. Step S12 comprises generating the first boolean value $B_1$ during a first cycle. Step S13 comprises generating a value $V_2$ corresponding to a second boolean value $B_2$ by utilizing a second segment having a second bit amount $N_2$ in the bit segment. Taking the situation in FIG. 4 as an example, the second bit amount $N_2$ is generated in the first half of the renormalization procedure during the cycle T1. Step S14 comprises fetching a new bit segment from the bitstream according to the first bit amount $N_1$ and the second bit amount $N_2$. Step S15, which may be performed simultaneously with Step S14, comprises generating the second boolean value $B_2$ during the first cycle.

Step S16 comprises generating a value $V_3$ corresponding to a third boolean value $B_3$. Step S17 comprises selectively adjusting the value $V_3$ after the buffer is updated according to the new bit segment. Taking the situation in FIG. 4 as an example, the value $V_3$ is generated in the second half of the renormalization procedure during the cycle T1, and the buffer is updated before the cycle T2 starts or ends. After the buffer is updated, the value $V_3$ is selectively adjusted according to the number of bits required by the value $V_3$. Step S18 comprises generating the third boolean value $B_3$ during the cycle T2 by utilizing the selectively updated value $V_3$.

Figure 1:
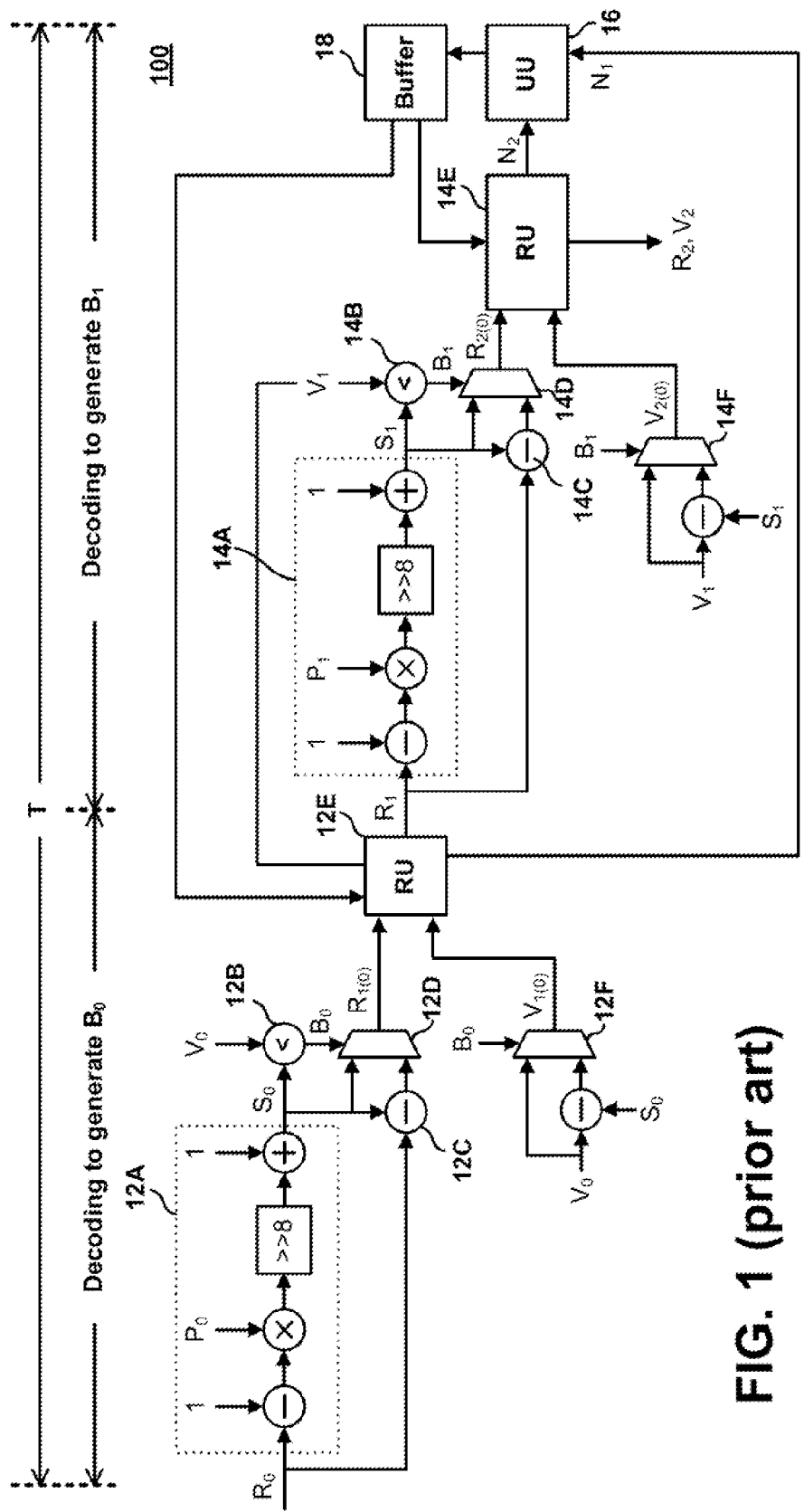
FIG. 1 is a block diagram of a stereotypic Boolean entropy decoder.
Figure 2:
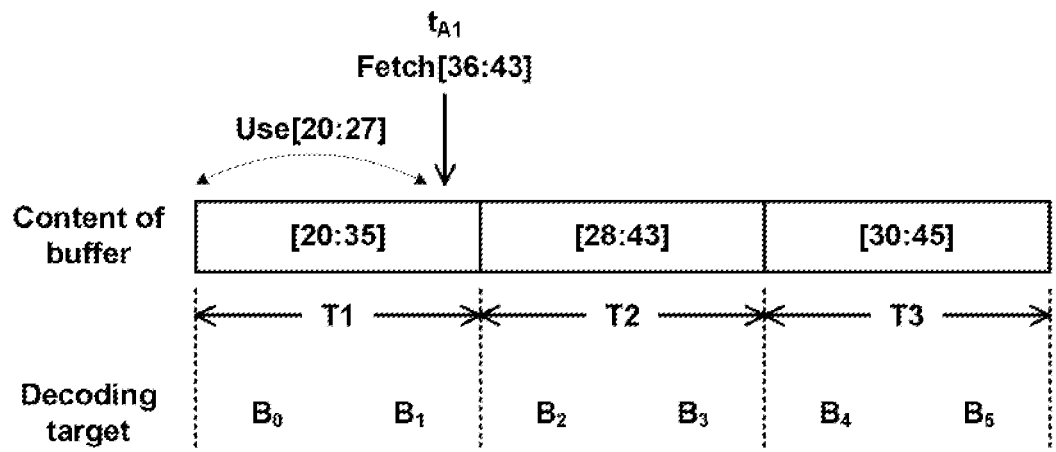
FIG. 2 is an example of a content of a buffer of a conventional Boolean entropy decoder.

The process shown in FIG. 10 may be implemented to various Boolean entropy decoders rather than being limited to the circuit structure shown in FIG. 1 or FIG. 6.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Boolean entropy decoder, for decoding a bitstream, comprising:
    a decoding module, for generating an initial boolean value, a first boolean value and a second boolean value according to the bitstream, requiring a first bit amount while generating a first value corresponding to the first boolean value, and requiring a second bit amount while generating a second value corresponding to the second boolean value; wherein, the first boolean value, the second value, the second boolean value and a temporary third value corresponding to a third boolean value are generated during a same cycle; the decoding module, comprising:
        a preliminary computing unit, for generating an adjusted split ($S_0$_m1) according to a range ($R_0$) and a probability ($P_0$) corresponding to the initial boolean value, and said adjusted split is equal to:

$$\frac{(R_0 - 1) * P_0}{256};$$

and
        a determining unit, for determining the first bit amount according to the adjusted split;
    a buffer, for temporarily storing a bit segment of the bitstream to be provided to the decoding module, the bit segment covering the first bit amount and the second bit amount; and
    an updating module, updating the buffer after fetching a new bit segment from the bitstream according to the first bit amount and the second bit amount;

wherein, the decoding module selectively adjusts the temporary third value corresponding to the third boolean value after the buffer is updated; and
    wherein, the first bit amount is a number of bits in the buffer required when said bitstream is fetched for generating the first value, and the second bit amount is a number of bits in the buffer required when the bitstream is fetched for generating the second value.

2. The Boolean entropy decoder according to claim 1, wherein the first bit amount and the second bit amount respectively have a maximum value of 7 bits, and the buffer has a capacity of 16 bits.

3. The Boolean entropy decoder according to claim 1, the first bit amount being in the range of 0 to N−1, N being a positive integer, the decoding module further comprising:
    a first adjusting unit, for generating (N−1) reference ranges according to the adjusted split;
    a second adjusting unit, for generating (N−1) reference values according to an initial value corresponding to the initial boolean value;
    N sets of calculating circuits, for generating N candidate boolean values according to the adjusted split, the initial value corresponding to the initial boolean value, the (N−1) reference ranges and the (N−1) reference values; and
    a first multiplexer, for selecting the second boolean value from the N candidate boolean values according to the first bit amount.

4. The Boolean entropy decoder according to claim 3, wherein the N sets of calculating circuits respectively generates a reference split, and the decoding module further comprises:
    a second multiplexer, for selecting a split corresponding to the first boolean value from the N reference splits according to the first bit amount;
    a third multiplexer, for selecting the first value corresponding to the first boolean value from the initial value corresponding to the initial boolean value and the (N−1) reference values according to the first bit amount; and
    a fourth multiplexer, for selecting a range corresponding to the first boolean value from the adjusted split and the (N−1) reference ranges according to the first bit amount.

5. The Boolean entropy decoder according to claim 3, wherein N equals 8.

6. The Boolean entropy decoder according to claim 3, wherein the first adjusting unit generates the reference ranges by utilizing at least one shifter.

7. A Boolean entropy decoding method applied to a video display system, for decoding a bitstream, the video display system comprising a buffer for temporarily storing a bit segment of the bitstream, the method comprising:
    generating a first value corresponding to a first boolean value by utilizing a first segment having a first bit amount in the bit segment;
    generating the first boolean value during a first cycle;
    generating a second value corresponding to a second boolean value by utilizing a second segment having a second bit amount in the bit segment;
    fetching a new bit segment from the bitstream according to the first bit amount and the second bit amount;
    generating the second boolean value during the first cycle;
    generating a temporary third value corresponding to a third boolean value, and selectively updating the third temporary third boolean value after the buffer is updated according to the new bit segment; and generating the third boolean value by utilizing the selectively adjusted temporary third value during a second cycle;

wherein, the first bit amount is a number of bits in the buffer required when said bitstream is fetched for generating the first value, and the second bit amount is a number of bits in the buffer required when the bitstream is fetched for generating the second value; and wherein, the first bit amount is determined according to an adjusted split ($S_{0\_m1}$), said adjusted split is generated according to a range ($R_0$) and a probability ($P_0$) corresponding to an initial boolean value, and said adjusted split is equal to:

$$\frac{(R_0 - 1) * P_0}{256}.$$

8. The method according to claim 7, wherein the first bit amount and the second bit amount respectively have a maximum value of 7 bits, and the buffer has a capacity of 16 bits.

9. The method according to claim 7, wherein the buffer is updated after the new bit segment is fetched from the bitstream or before the second cycle starts.

10. The method according to claim 7, wherein the first boolean value, the second value and the second boolean value are generated during the first cycle.

* * * * *